United States Patent
Wu

(10) Patent No.: US 7,880,210 B2
(45) Date of Patent: Feb. 1, 2011

(54) INTEGRATED CIRCUIT INCLUDING AN INSULATING STRUCTURE BELOW A SOURCE/DRAIN REGION AND METHOD

(75) Inventor: Dongping Wu, Dresden (DE)

(73) Assignee: Qimonda AG, Munich (DE)

( * ) Notice: Subject to any disclaimer, the term of this patent is extended or adjusted under 35 U.S.C. 154(b) by 333 days.

(21) Appl. No.: 12/126,102

(22) Filed: May 23, 2008

(65) Prior Publication Data

US 2009/0289288 A1    Nov. 26, 2009

(51) Int. Cl.
*H01L 27/108* (2006.01)
*H01L 21/8242* (2006.01)

(52) U.S. Cl. .............................. 257/296; 257/E21.008; 438/241

(58) Field of Classification Search .................. 257/296, 257/303, 330, 332, E21.008, 213, 368; 438/241, 438/270, 199
See application file for complete search history.

(56) References Cited

U.S. PATENT DOCUMENTS 5,801,412 A * 9/1998 Tobita ........................ 257/296
6,100,159 A 8/2000 Krivokapic 2003/0040185 A1  2/2003 Jun et al.
2005/0280052 A1  12/2005 Holz et al.
2005/0285194 A1  12/2005 Lee et al.
2007/0210367 A1 * 9/2007 Bernhardt et al. ............ 257/306
2007/0278549 A1 * 12/2007 Spitzer ........................ 257/302

OTHER PUBLICATIONS

"Quasi-SOI MOSFETs—A Promising Bulk Device Candidate for Extremely Scaled Era", Yu Tian, et al., IEEE Transcations on Electron Devices, vol. 54, No. 7, Jul. 2007.

* cited by examiner

*Primary Examiner*—Thomas L Dickey
*Assistant Examiner*—Nikolay Yushin
(74) *Attorney, Agent, or Firm*—Dicke, Billig & Czaja, PLLC

(57) ABSTRACT

An integrated circuit including an insulating structure below a source/drain region and a method. One embodiment includes a memory cell with an access transistor and a storage element. A first source/drain region of the access transistor is electrically coupled to the storage element. A first insulating structure is disposed between the first source/drain region and a first portion of a semiconductor substrate, the first portion being arranged below the first source/drain region. A channel region of the access transistor is formed between the first and a second source/drain region of the access transistor in an active area being electrically coupled to the first portion of the semiconductor substrate.

10 Claims, 14 Drawing Sheets

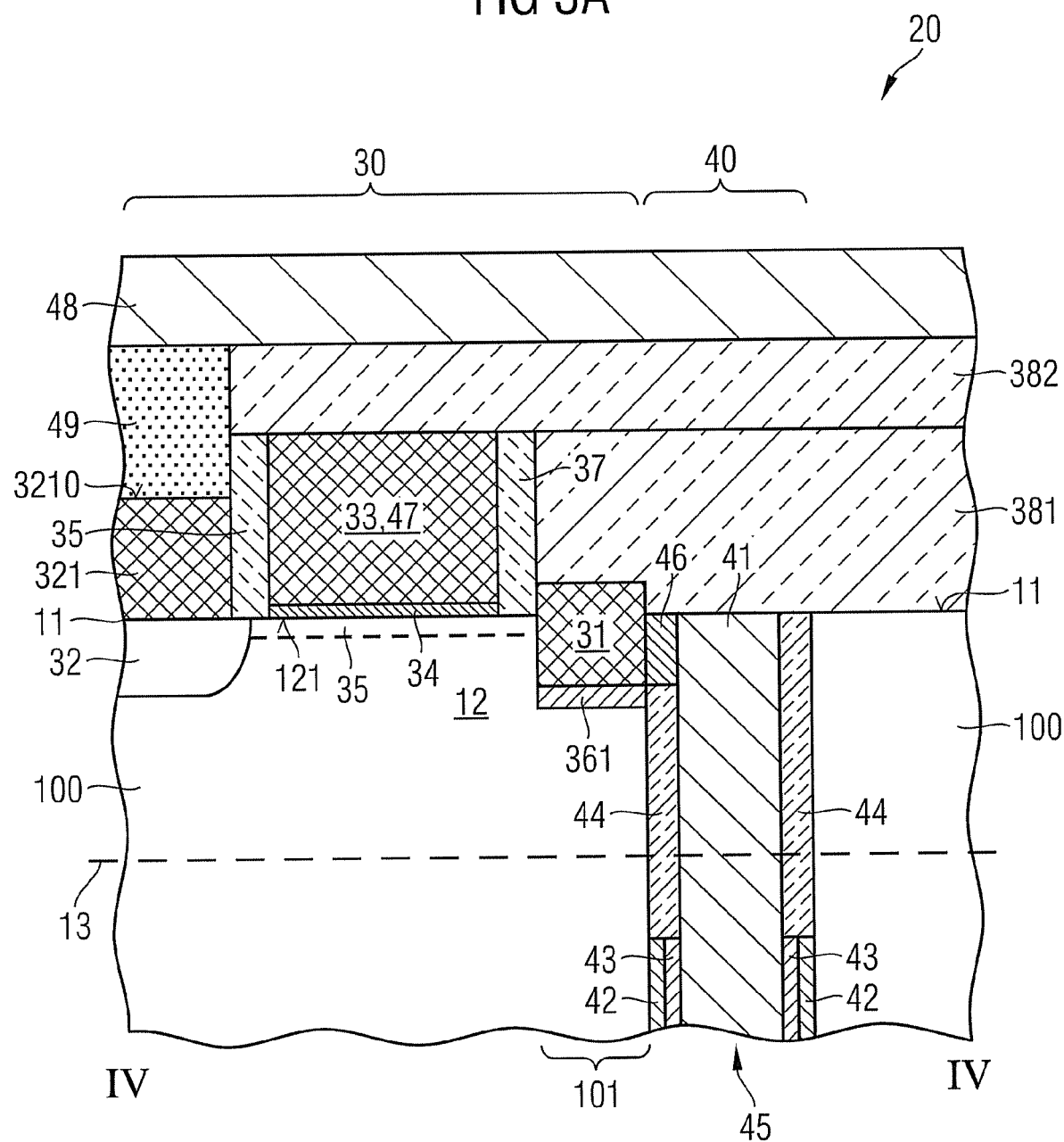

US 7,880,210 B2

INTEGRATED CIRCUIT INCLUDING AN INSULATING STRUCTURE BELOW A SOURCE/DRAIN REGION AND METHOD

BACKGROUND

Memory devices, like DRAMs (Dynamic Random Access Memories) include an access transistor and a storage element, for instance a storage capacitor. While lateral dimensions of the access transistor are shrinking, other features of the access transistor, for instance the driving current, the leakage current from the source/drain regions, the Drain Induced Barrier Leakage (DIBL) and short channel effects may become important.

SUMMARY

An integrated circuit includes a memory cell with an access transistor and a storage element. A first source/drain region of the access transistor is electrically coupled to the storage element. A first insulating structure is disposed between the first source/drain region and a first portion of a semiconductor substrate, the first portion being arranged below the first source/drain region. A channel region of the access transistor is formed between the first and a second source/drain region of the access transistor in an active area being electrically coupled to the first portion of the semiconductor substrate.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 3A illustrates a cross-sectional view of an upper part of one embodiment of an integrated circuit including a memory cell with an access transistor, a first insulating structure and a trench capacitor, along the first direction.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1A:
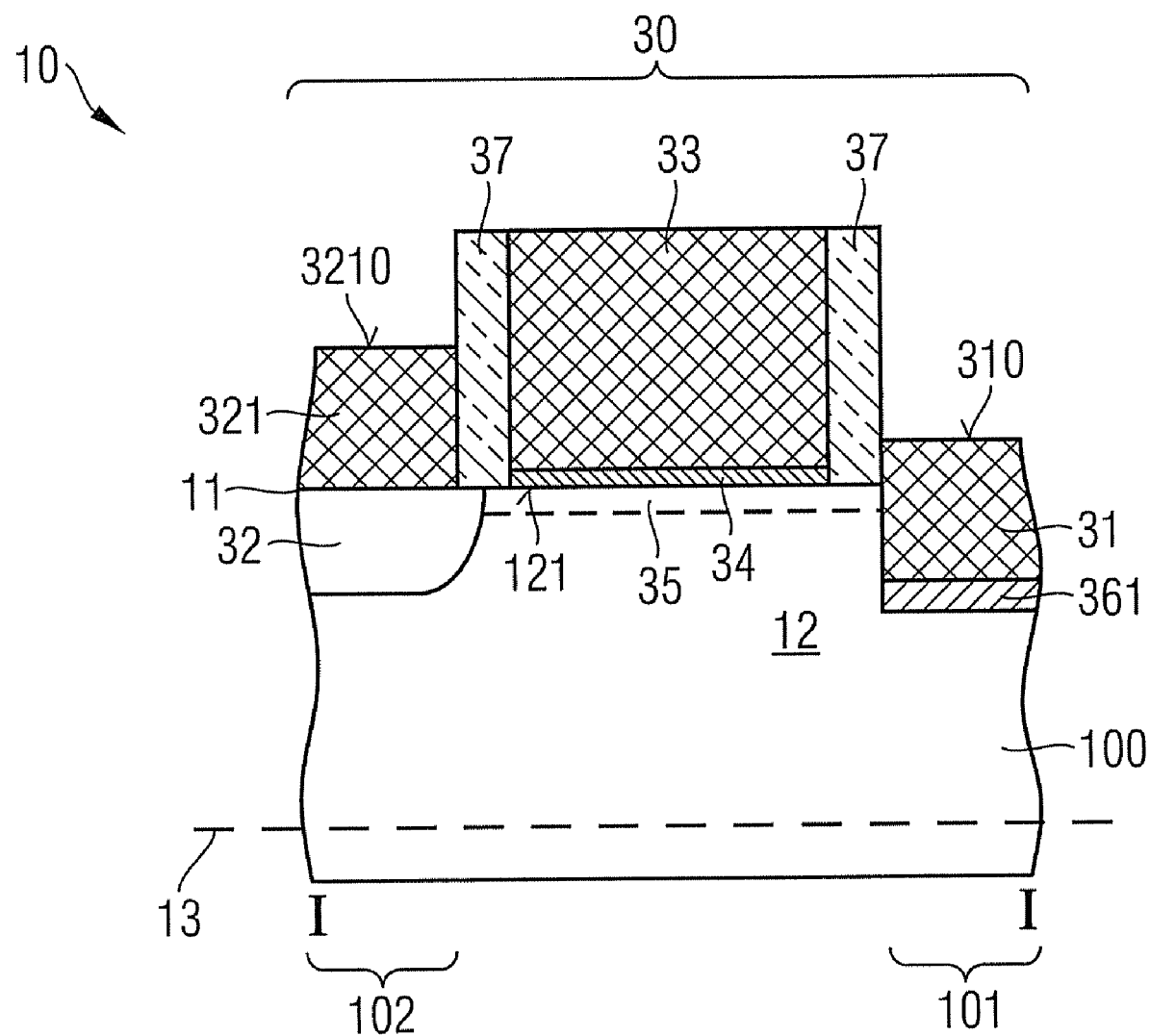
FIG. 1A illustrates a cross-sectional view of one embodiment of an integrated circuit with a transistor and a first insulating structure along a first direction.

FIG. 1A illustrates a cross-sectional view of one embodiment of an integrated circuit 10 with a transistor 30 along intersectional line I-I which extends along a first direction. The transistor 30 includes first and second source/drain regions 31, 32, a channel region 35 formed between the first and the second source/drain region 31, 32, and a gate electrode 33 controlling an electrical current flowing between the first and second source/drain regions 31, 32. A virtual line connecting the first and the second source/drain region 31, 32 extends along the first direction. The gate electrode 33 is electrically insulated from the channel region 35 by a gate dielectric 34. The transistor 30 may be partially formed in a semiconductor substrate 100, for instance the second source/drain region 32 and the channel region 35 may be formed in the semiconductor substrate 100. The portion of the semiconductor substrate 100 in which the channel region 35 is formed, generally is denoted as an active area 12.

The integrated circuit 10 further includes a first insulating structure 361 which is disposed between the first source/drain region 31 and a first portion 101 of the semiconductor substrate 1 00. The first portion 101 is arranged below the first source/drain region 31. The channel region 35 is electrically coupled to the first portion 101. The first insulating structure 361 may include horizontal portions which are formed in a plane parallel to a plane of an upper surface 121 of the active area 12. The first insulating structure 361 may further include other portions formed in a plane which is not parallel to the upper surface 121. The first insulating structure 361 electrically insulates the first source/drain region 31 from the first portion 101. An area of the first source/drain region 31 where a junction leakage current to the semiconductor substrate 100 may arise is reduced compared to a transistor without the first insulating structure 361. Thus the leakage current may be reduced.

As used herein, the term "electrically coupled" is not meant to mean that the elements must be directly coupled together. In the context of the present specification, intervening elements may be provided between the "electrically coupled" elements.

The integrated circuit 10 may further include spacers 37 formed at sidewalls of the gate electrode 33 and of the gate dielectric 34. The integrated circuit 10 may further include an additional semiconductor material 321 formed above an upper surface 11 of the semiconductor substrate 100. The additional semiconductor material 321 may form a part of the second source/drain region 32 or may form a portion of a contact to the second source/drain region 32.

The term "semiconductor substrate" used in the description may include any semiconductor-based structure that has a semiconductor surface. Structure is to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, gallium arsenide, or others. Further components, devices, or integrated circuits may be formed within the semiconductor substrate. The semiconductor substrate 100 has a first conductivity type.

The first and the second source/drain region 31, 32 and the additional semiconductor material 321 may be formed of any semiconductor material, such as silicon, silicon-germanium, germanium, gallium arsenide, or others and may contain further elements like carbon. The semiconductor material may be amorphous, monocrystalline or polycrystalline. The first and the second source/drain region 31, 32 have a second conductivity type opposite to the first conductivity type. The additional semiconductor material 321 may be doped or undoped.

The spacers 37 and the first insulating structure 361 may include any insulating material or layer stacks of different insulating materials. Insulating material includes $SiO_2$, $SiO_x$, $Si_3N_4$, $Si_xN_y$, fluorinated silicate glass (FSG), boro-phosphorous silicate glass (BPSG), or other suitable dielectric material.

An upper surface 310 of the first source/drain region 31 may be formed above the upper surface 11 of the semiconductor substrate 100. Nevertheless, the upper surface 310 may be formed at the same distance measured from a reference position 13 of the integrated circuit 10 as the upper surface 11 or at a smaller distance. An upper surface 3210 of the additional semiconductor material 321 may be formed at the same distance measured from the reference position 13 as the upper surface 310 or at a different distance.

Figure 1B:
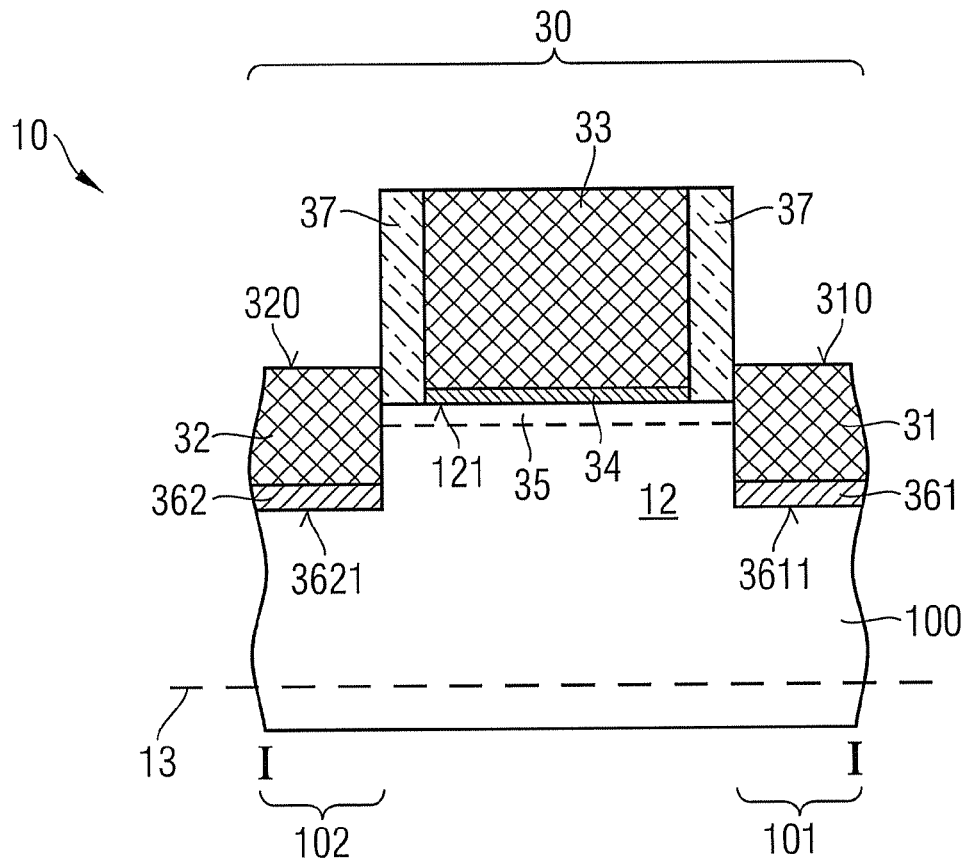
FIG. 1B illustrates a cross-sectional view of one embodiment of an integrated circuit with a transistor and a first and a second insulating structure along the first direction.

FIG. 1B illustrates a cross-sectional view of another embodiment of the integrated circuit 10 along intersectional line I-I which extends along the first direction. The integrated circuit 10 includes a transistor 30 and a first and a second insulating structure 361, 362. The first insulating structure 361 is disposed between a first source/drain region 31 of the access transistor 30 and a first portion 101 of a semiconductor substrate 100, wherein the first portion 101 is arranged below the first source/drain region 31. The second insulating structure 362 is disposed between a second source/drain region 32 of the access transistor 30 and a second portion 102 of the semiconductor substrate 100, wherein the second portion 102 is arranged below the second source/drain region 32. A channel region 35 of the access transistor 30 is electrically coupled to the first and the second portion 101, 102. The second insulating structure 362 may be formed of an insulating material as described above with respect to the first insulating structure 361. The first and the second insulating structure 361, 362 may include the same insulating material or different insulating materials and may have the same thickness or different thicknesses.

A lower surface 3611 of the first insulating structure 361 and a lower surface 3621 of the second insulating structure 362 may be formed at the same distance from the reference position 13 of the integrated circuit 10 or at different distances. An upper surface 310 of the first source/drain region 31 and an upper surface 320 of the second source/drain region 32 may be formed at the same distance from the reference position 13 or at different distances.

The transistor 30 of FIGS. 1A and 1B may be formed as a planar transistor wherein the channel region 35 includes only horizontal portions. According to other embodiments, the transistor 30 may be a RCAT (Recessed Channel Array Transistor), a U-groove transistor, a EUD (Extended U-shape Device) transistor, or another transistor. The channel region 35 may include horizontal and vertical portions. The upper surface 121 of the active area 12, which is adjacent to the horizontal portion of the channel region 35, may be formed at the same distance measured from the reference position 13 of the integrated circuit 10 as the upper surface 11 of the semiconductor substrate 100 or at a lower distance than the upper surface 11. The gate electrode 33 may be arranged at one, two or three sides of the channel region 35.

Figure 1C:
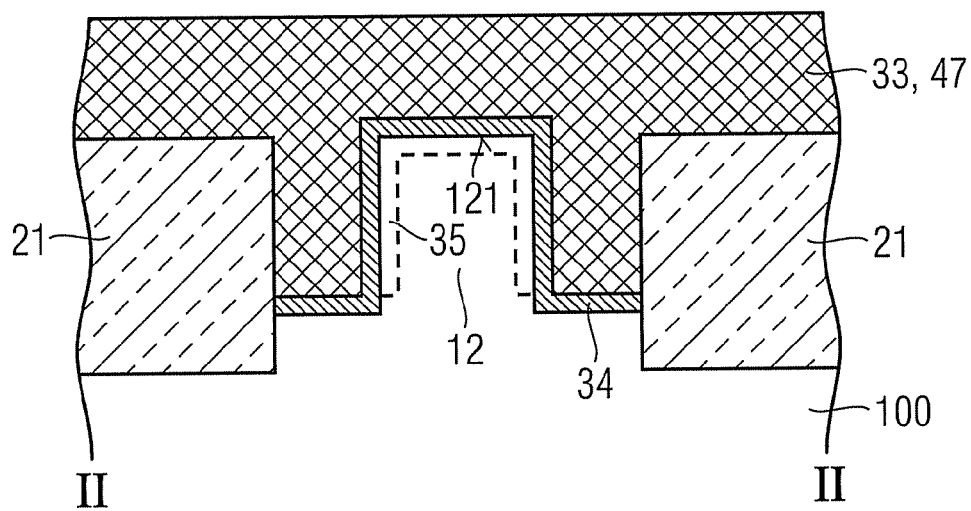
FIG. 1C illustrates a cross-sectional view of one embodiment of the transistor of FIG. 1A or FIG. 1B along a second direction.

FIG. 1C illustrates a cross-sectional view of an embodiment of the transistor 30 along intersection line II-II which extends along a second direction perpendicular to the first direction. The transistor 30 may be a so called Fin-FET, wherein the active region 12 has the shape of a ridge or a fin and the channel region 35 includes vertical portions and a horizontal portion. The gate electrode 33 encloses the active area 12 at three sides and includes vertical portions adjacent to the vertical portions of the channel region 35. Neighboring active areas 12 are insulated from each other by isolation trenches 21, which are formed in the semiconductor substrate 100 and are filled with an insulating material. The insulating material filling the isolation trenches 21 may include an insulating material as described above with respect to the first insulating structure 361. The vertical portions of the gate electrode 33 are disposed between the gate dielectric 34 and adjacent ones of the isolation trenches 21 and may be formed by depositing a conductive material into the space between the gate dielectric 34 and the isolation trenches 21.

Since a channel length of a Fin-FET is smaller compared with that of a EUD transistor or a RCAT having the same lateral distance between the first and the second source/drain region, an electric field is higher and a leakage current is larger. The use of the first insulating structure therefore improves the performance of the Fin-FET and allows the use of the Fin-FET in integrated circuits where a small leakage current may be important.

The Fin-FET may be formed as a Damascene or Bulk Fin-FET, wherein the active area 12 is a part of a bulk semiconductor substrate. Nevertheless, the Fin-FET may be formed as an SOI-Fin-FET, wherein the active area 12 is a part of a thin semiconductor layer formed on an insulating layer. If one of the source/drain regions does not extend over the whole thickness of the semiconductor layer, an insulating structure as described with respect to the first or the second insulating structure 361, 362 may improve the performance of the SOI-Fin-FET as well.

Figure 2:
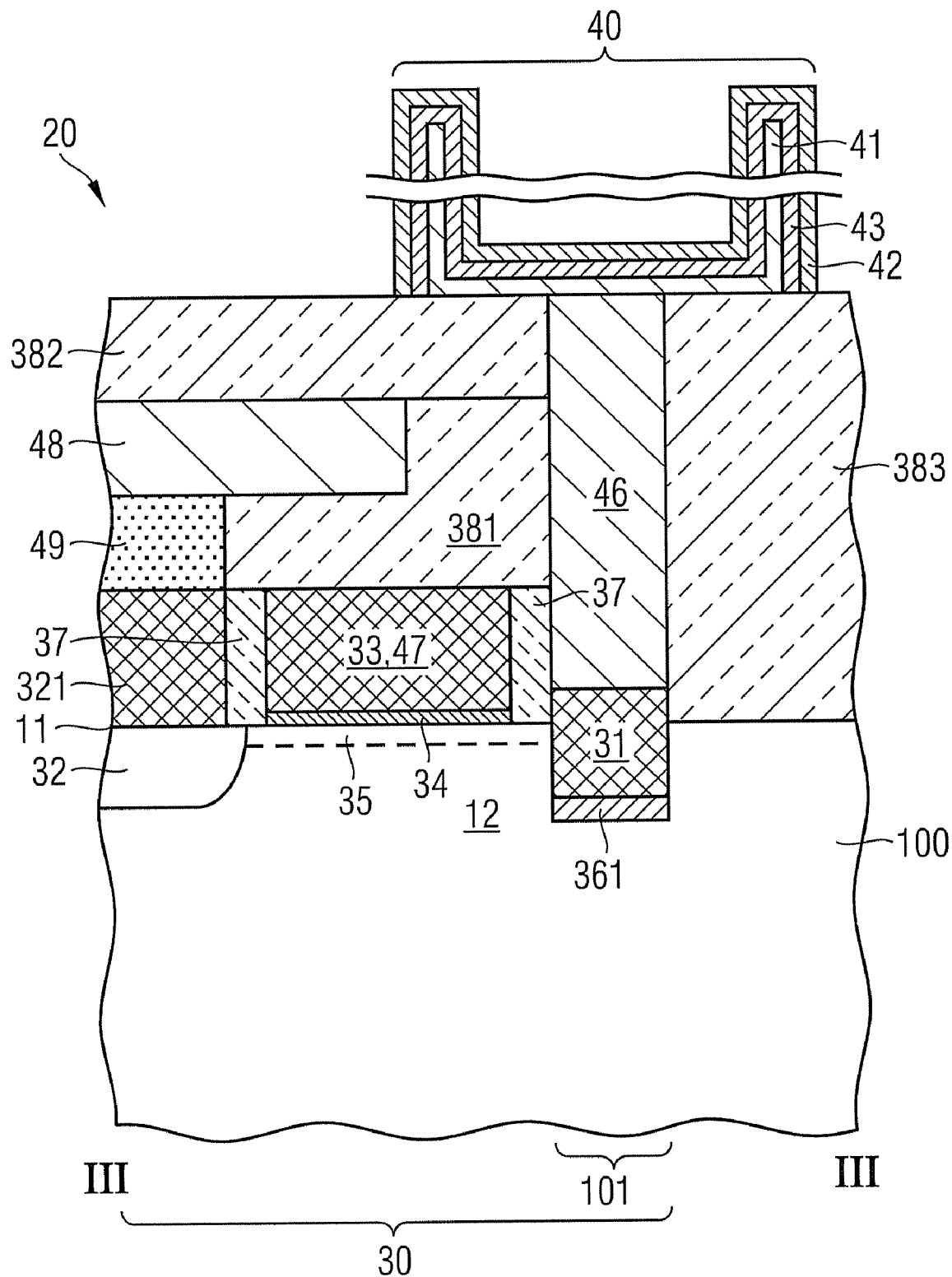
FIG. 2 illustrates a cross-sectional view of one embodiment of an integrated circuit including a memory cell with an access transistor, a first insulating structure and a stack capacitor, along the first direction.

FIG. 2 illustrates a cross-sectional view of another embodiment of an integrated circuit including a memory cell 20 along intersectional line III-III which extends along the first direction. The memory cell 20 includes an access transistor 30 as described with respect to FIGS. 1A to 1C and a storage element. The storage element may be a storage capacitor 40 which may be formed as a stacked capacitor formed above the upper surface 11 of the semiconductor substrate 100. The first source/drain region 31 is electrically coupled to the storage element. For instance, the first source/drain region 31 may be electrically coupled to a first capacitor electrode 41 of the storage capacitor 40. The storage capacitor 40 further includes a second capacitor electrode 42 and a capacitor dielectric 43 disposed between the first and the second capacitor electrode 41, 42. A node contact 46 may be disposed between the first source/drain region 31 and the first capacitor electrode 41. The integrated circuit further includes a first insulating structure 361 disposed between the first source/drain region 31 of the access transistor 30 and a first portion 101 of the semiconductor substrate 100, wherein the first portion 101 is arranged below the first source/drain region 31. The channel region 35 of the access transistor is electrically coupled to the first portion 101.

The integrated circuit may further include an additional semiconductor material 321 formed above an upper surface 11 of the semiconductor substrate 100. The additional semiconductor material 321 may form a part of the second source/drain region 32 or may form a portion of a contact to the second source/drain region 32.

Furthermore, the integrated circuit may include spacers 37 formed at sidewalls of the gate electrode 33 and of the gate dielectric 34 and insulating materials 381, 382, 383. The gate electrode 33 may form a part of a word line 47, wherein the word line 47 may include further layers of a conductive material. The second source/drain region 32 may be electrically coupled to a bit line 48 by a bit line contact 49. By addressing the access transistor 30 via the word line 47 and the bit line 48, an information may be stored in the storage element or may be read out from it.

The gate electrode 33, the first and the second capacitor electrode 41, 42, the node contact 46, the word lines 47, the bit line 48, and the bit line contact 49 may, for example, be made of a conductive material or of a layer stack of conductive materials such as a doped semiconductor material, a silicide, a metal, a noble metal or a metal alloy. Examples of the conductive material include polysilicon, Co, Ni, Ti, Ta, W, NiPt, TiN, TaN, TaSiN, Ru, WN, and HfN, or other suitable materials and combinations of such materials. Silicides include CoSi, TiSi, NiSi, NiPtSi, WSi$_x$, TaSi, or other suitable silicide.

The gate dielectric 34 and the capacitor dielectric 43 may be made of any suitable dielectric material. Examples of the dielectric material include SiO$_2$, SiO$_x$, Si$_3$N$_4$, Si$_x$N$_y$, or other suitable dielectric material. The capacitor dielectric 43 may further include a high-k dielectric having a dielectric constant larger than 3.9. For example, HfO$_2$, HfSiO (hafniumsilicate), ZrO$_2$, Al$_2$O$_3$, HfAlO, TaO and any multilayer system including any of these layers may be taken.

The insulating materials 381, 382, 383 may include any insulating material or layer stacks of different insulating materials as described with respect to the first insulating structure 361.

FIG. 3A illustrates a cross-sectional view of an upper part of an embodiment of an integrated circuit including a memory cell 20 along intersectional line IV-IV which extends along the first direction. The memory cell 20 includes an access transistor 30 as described with respect to FIG. 2 and a storage element. The storage element may be a storage capacitor 40 which may be formed in a trench 45 formed in a semiconductor substrate 100, as is illustrated in FIG. 3A. The access transistor 30 may be formed as a transistor 10 as described with respect to FIGS. 1A to 1C.

The first source/drain region 31 is electrically coupled to the storage element. For instance, the first source/drain region 31 may be electrically coupled to a first capacitor electrode 41 of the storage capacitor 40 by a node contact 46. In an upper portion of the storage capacitor 40, a collar 44 formed of an insulating material is disposed between the first capacitor electrode 41 and the semiconductor substrate 100.

Figure 3B:
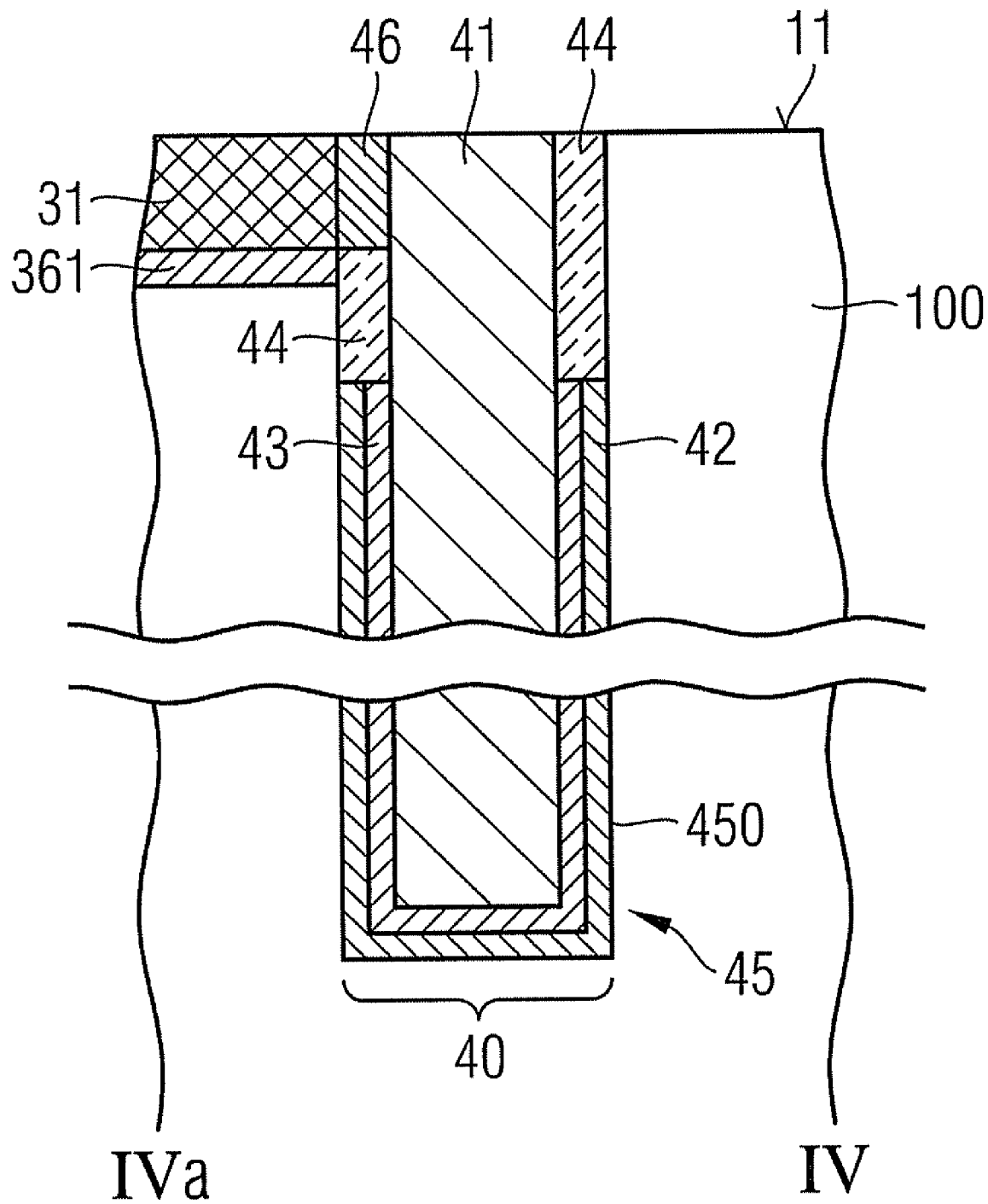
FIG. 3B illustrates a cross-sectional view of a lower part of the memory cell illustrated in FIG. 3A.

FIG. 3B illustrates a cross-sectional view of a lower part of the memory cell 20 of FIG. 3A. The second capacitor electrode 42, the collar 44 and the node contact 46 line a contour of the trench 45. The trench 45 may have a circular, an oval, a rectangular or any other shape in a plane view. The trench 45 has a trench surface 450 extending within the semiconductor substrate 100. The trench surface 450 may extend into the substrate 100 from the substrate surface 11 with an angle measured between the trench surface 450 and a direction perpendicular to the substrate surface 11. The profile of the trench surface 450 may be vertical or even reentrant.

The trench 45 may have the shape of a cylinder, a cone with straight sidewalls, a cone with bowed or waved sidewalls or may have the shape of a bottle with a small trench width near the substrate surface 11 and a larger trench width at a higher trench depth, as for example. The width of the trench 45 and the angle of the trench surface 450 to a perpendicular direction to the substrate surface 11 may vary over the depth of the trench 45.

Usually, a leakage current at the junction of the first source/drain region and the storage element may be critical. Since a first insulating structure is disposed beneath the first source/drain region, a leakage current may be reduced at a junction of the first source/drain region and the storage element. As a result, the performance of the memory cell 20 may be improved. According to an implementation, an insulating structure may not be formed beneath the second source/drain region. As a result, the second source/drain region may not be altered by forming an insulating structure beneath it. Hence, the resistance of the current path from the channel region to the bit line may be reduced. Nevertheless, the access transistor 30 of the memory cells 20 illustrated in FIGS. 2 to 3B may include a second insulating structure 362 as described with respect to FIG. 1B. Several other combinations of the embodiments of the integrated circuit illustrated in FIGS. 1A to 3B may be formed.

Figure 4:
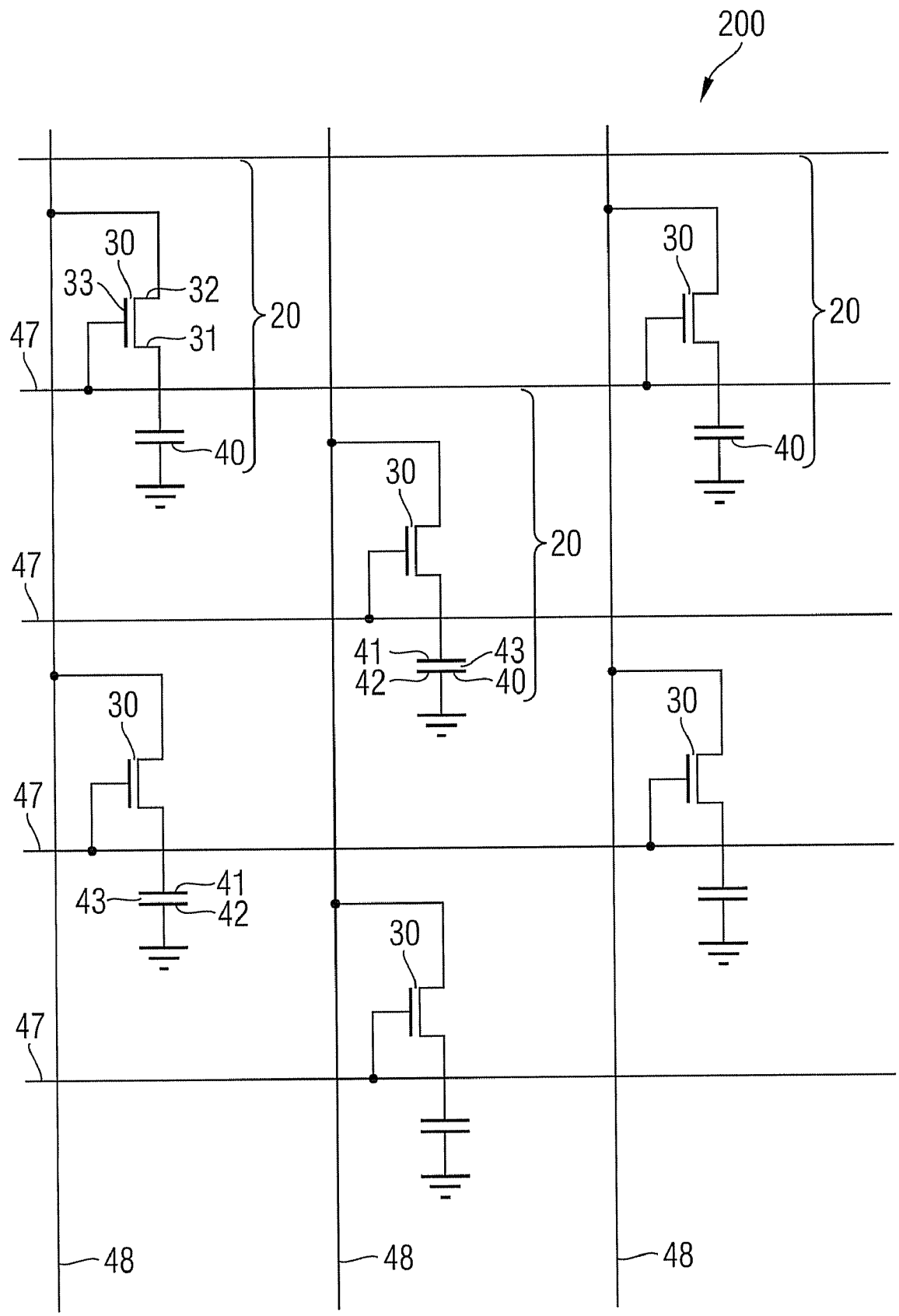
FIG. 4 is a schematic circuit diagram illustrating one embodiment of an integrated circuit including a memory cell array.

FIG. 4 is a schematic circuit diagram of an embodiment of an integrated circuit including a memory cell 20 as described above. A memory cell array 200 includes a plurality of memory cells 20. Individual ones of the memory cells 20 may include an access transistor 30 and a storage element, for instance, a storage capacitor 40. A first source/drain region 31 of the access transistor 30 is electrically coupled to the storage element, for instance, to a first capacitor electrode 41. Second source/drain regions 32 of individual memory cells 20 may be electrically coupled to a bit line 48. Gate electrodes 33 of individual memory cells 20 may be electrically coupled to a word line 47. The memory cell array may include a plurality of bit lines 48 and a plurality of word lines 47. The memory array 200 may be a part of a memory device, like a DRAM.

Figure 5A:
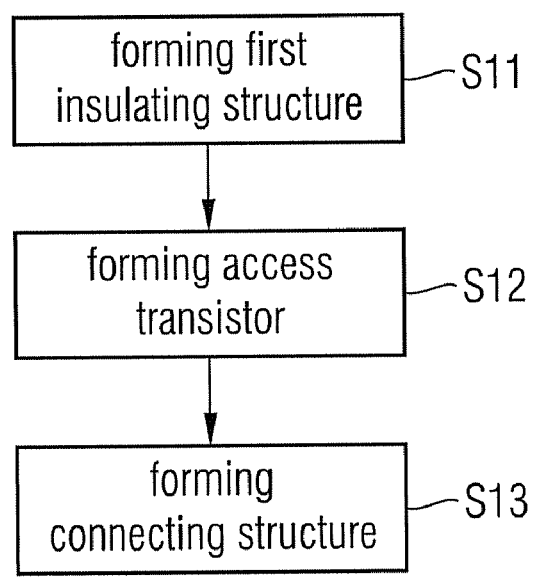
FIG. 5A illustrates a flow chart illustrating a method of manufacturing an integrated circuit including a memory cell with an access transistor, a first insulating structure and a storage element in accordance with one embodiment.

FIG. 5A is a flow chart illustrating a method of manufacturing an integrated circuit including a memory cell with an access transistor, a first insulating structure and a storage element in accordance with an embodiment. The first insulating structure is formed above a first portion of a semiconductor substrate (S11). An access transistor is formed (S12), wherein a first source/drain region is formed above the first insulating structure and wherein a channel region is formed such that it is electrically coupled to the first portion of the semiconductor substrate. A connecting structure is formed which is configured to electrically couple the first source/drain region to a storage element (S13). The connecting structure may for instance be a node contact.

According to other embodiments, the method may further include forming a second insulating structure above a second portion of the semiconductor substrate. The channel region may be electrically coupled to the second portion. Forming the access transistor may include forming a second source/drain region above the second insulating structure. The method may further include forming the storage element. Moreover, the method may include forming a bit line and a word line and forming connecting structures which are configured to electrically couple a gate electrode of the access transistor to the word line and a second source/drain region of the access transistor to the bit line.

Figure 5B:
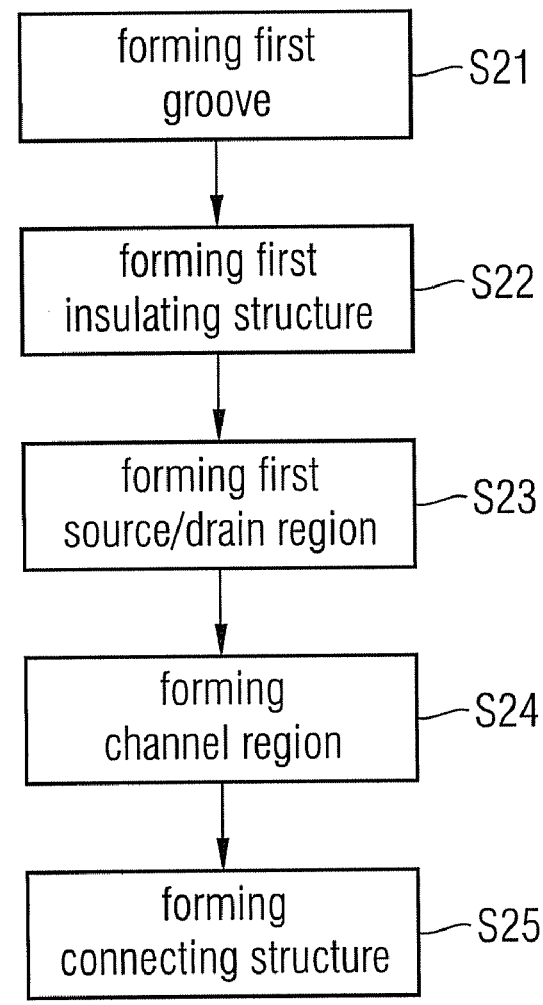
FIG. 5B is a flow chart illustrating a method of manufacturing an integrated circuit including a memory cell with an access transistor, a first insulating structure and a storage element in accordance with one embodiment.

FIG. 5B is a flow chart illustrating a method of manufacturing the integrated circuit in accordance with a further embodiment. A first groove is formed in a semiconductor substrate above a first portion of the semiconductor substrate (S21). A first insulating structure is formed at a bottom portion of the first groove (S22). A first source/drain region of an access transistor is formed above the first insulating structure (S23). A channel region of the access transistor is formed such that it is electrically coupled to the first portion of the semiconductor substrate (S24). A connecting structure is formed which is configured to electrically couple the first source/drain region to a storage element (S25).

According to another embodiment, the method may further include forming a second groove above a second portion of the semiconductor substrate and forming a second insulating structure at a bottom portion of the second groove. The channel region may be electrically coupled to the second portion. Forming the access transistor may include forming a second source/drain region above the second insulating structure.

In any of the methods listed above, the succession in which the individual processes are listed does not necessarily define the succession in which the processes are actually performed. In addition, each of the processes may include various sub-steps so that the succession of the sub-steps of one process may be mixed with the succession of the sub-steps of another processing step. If, for instance, a method recites "forming an access transistor" and "forming a storage element", a first part of the components of the storage element may be formed before or after forming a first part of the components of the access transistor, and a second part of the components of the access transistor may be formed before or after forming a second part of the components of the storage element. Furthermore, individual sub-steps of different processes may be performed simultaneously. For instance, first and second grooves, first and second insulating structures, or first and second source/drain regions may be formed simultaneously.

FIGS. 6 to 11B illustrate cross-sectional views of a portion of an integrated circuit according to embodiments of the method. FIGS. 7A, 8A, 9A, 10A, and 11A illustrate cross-sectional views according to an embodiment including a first insulating structure, whereas FIGS. 7B, 8B, 9B, 10B, and 11B illustrate cross-sectional views according to another embodiment including a first and a second insulating structure.

Figure 6:
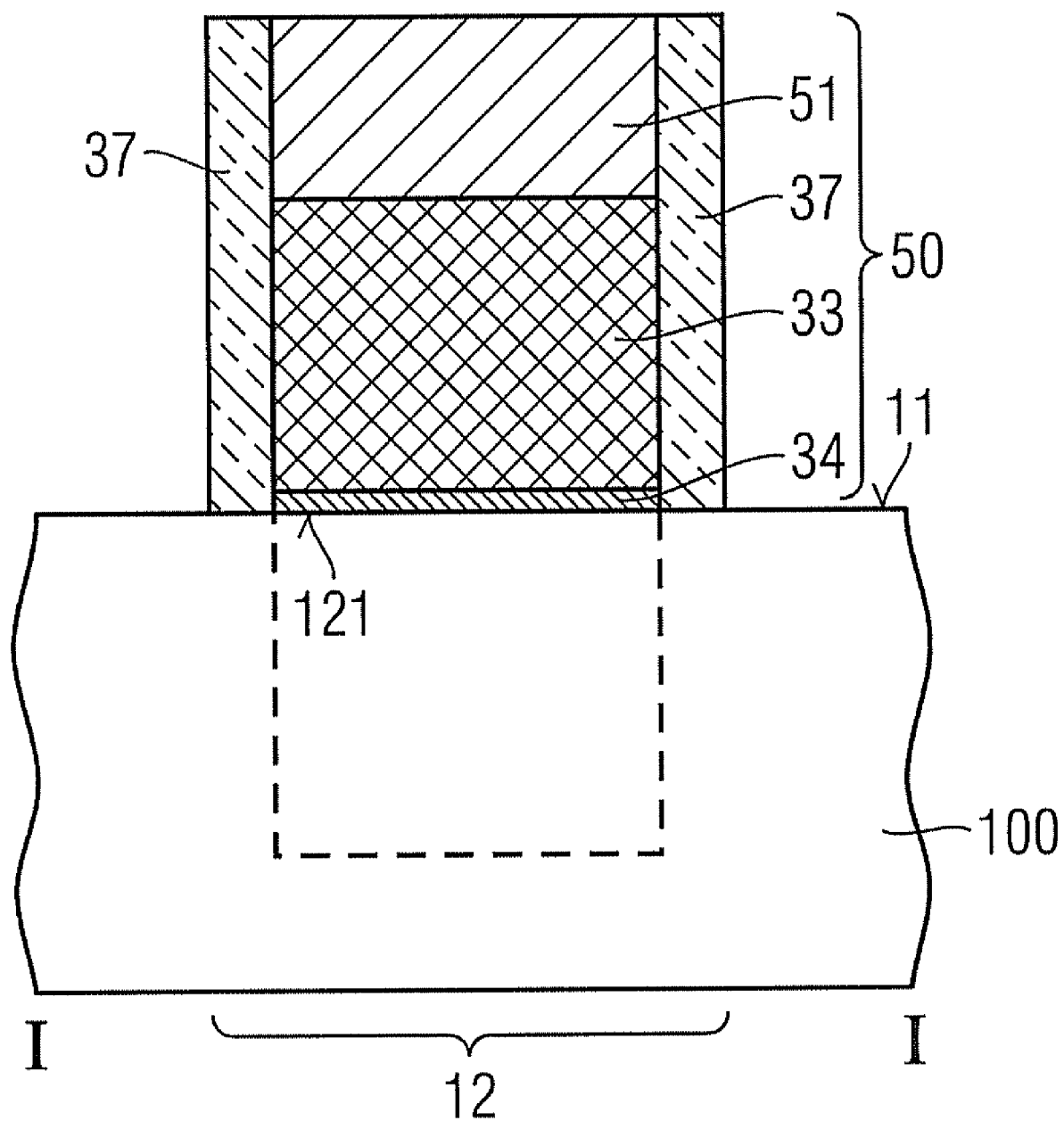
FIG. 6 illustrates a cross-sectional view of a portion of an integrated circuit including a first masking structure for illustrating a method of manufacturing an integrated circuit in accordance with one embodiment.

FIG. 6 illustrates a cross-sectional view of the portion of the integrated circuit along the first direction. A first masking structure 50 is formed on an upper surface 121 of an active region 12 of a semiconductor substrate 100. In the active region 12, a channel region of an access transistor of the integrated circuit is configured to be formed. The active region 12 may include portions, where the upper surface 121 is formed below an upper surface 11 of the semiconductor substrate 100, like for instance in a RCAT. The active region 12 may have the shape of a ridge, as described with respect to FIG. 1C. The first masking structure 50 may include a gate dielectric 34, a gate electrode 33, a cap layer 51 and spacers 37. Parts of the first masking structure 50 may be formed below the upper surface 11 of the semiconductor substrate 100. The dashed line illustrated in FIG. 6 illustrates, by way of example, a vertical portion of the gate electrode 33 as described with respect to FIG. 1C. In the following figures, for the sake of simplicity, the dashed line is not illustrated.

The first masking structure 50 may include any materials, layers or layer stacks which are suited for further processing as described in the following. The cap layer 51 may, for instance, be formed of an insulating material as described with respect to the spacers 37. For example, the cap layer may be formed of SiN and the spacers 37 may be formed of $SiO_x$. Insulating materials of the cap layer 51 and the spacers 37 may be formed by deposition using chemical vapor deposition (CVD), high density plasma-chemical vapor deposition (HDP-CVD), atomic layer deposition (ALD), metal organic chemical vapor deposition (MOCVD), physical vapor deposition (PVD), jet vapor deposition (JVD), or other suitable deposition technique.

A first groove 61 is formed in the semiconductor substrate 100 above a first portion 101 of the semiconductor substrate 100. The first portion 101 is adjacent to a first side of the active area 12. The first groove 61 extends to a depth d1 measured from the upper surface 11. The depth d1 may be not smaller than 30 nm, the depth d1 may be not larger than 50 nm. The first groove 61 has a bottom portion 611 and a sidewall 612.

Figure 7A:
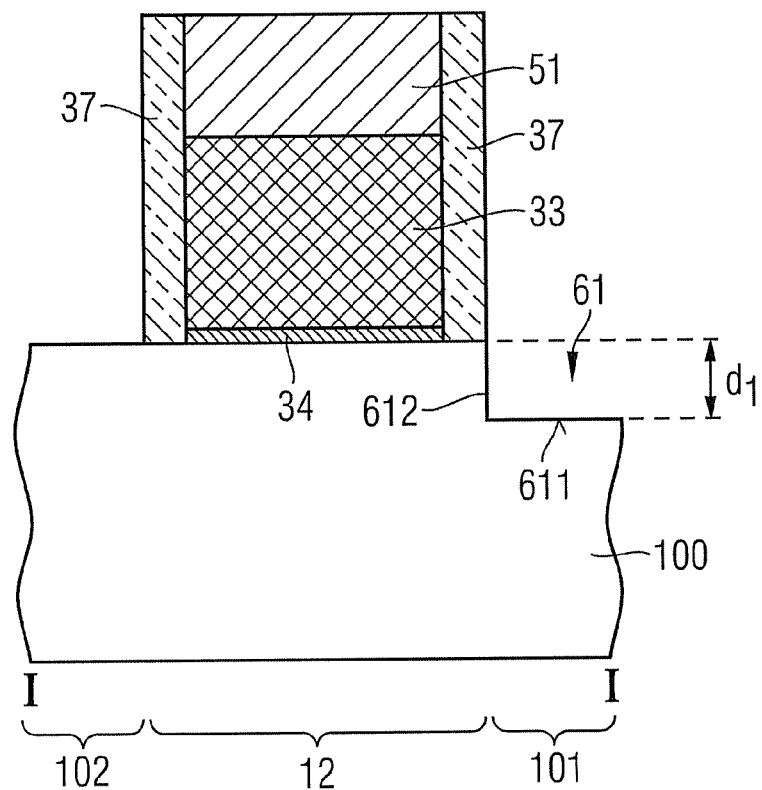
FIG. 7A illustrates a cross-sectional view of the portion of the integrated circuit of FIG. 6 after forming a first groove in accordance with one embodiment.

A mask protecting the semiconductor substrate 100 from being processed, for instance a photoresist material or an insulating material, may be formed above a second portion 102 of the semiconductor substrate 100 before forming the first groove 61. The second portion 102 is adjacent to a second side of the active area 12, the second side being arranged opposite to the first side. Thus, no groove will be formed above the second portion 102 of the semiconductor substrate 100. The mask may be removed after forming the first groove 61. The resulting structure is illustrated in FIG. 7A.

Figure 7B:
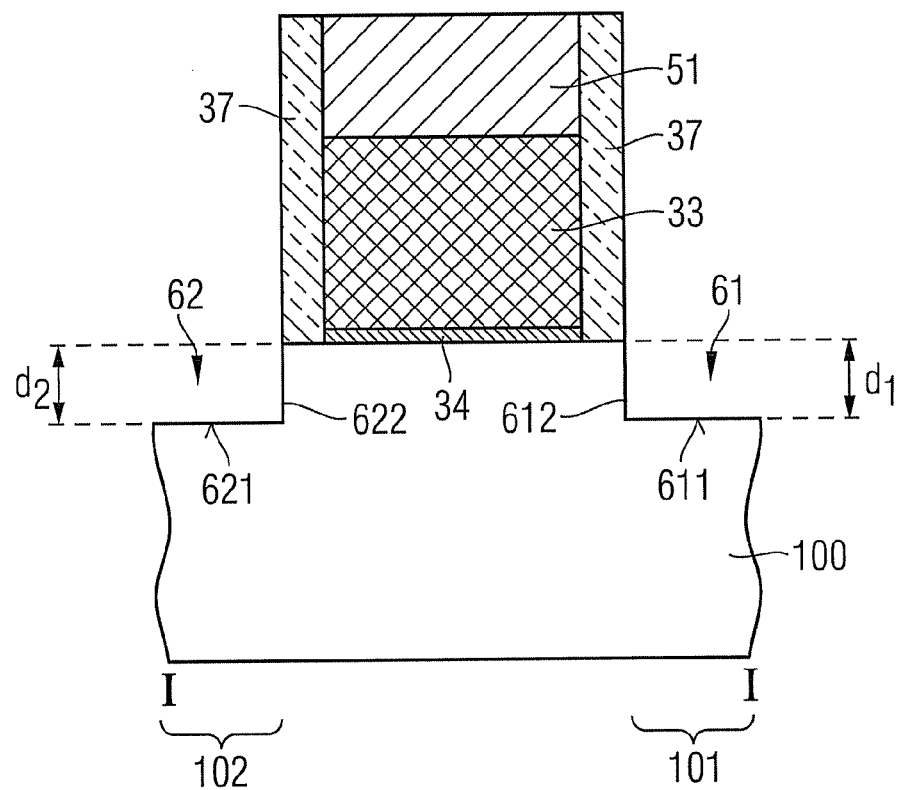
FIG. 7B illustrates a cross-sectional view of the portion of the integrated circuit of FIG. 6 after forming a first and a second groove in accordance with one embodiment.

A second groove 62 may be formed in the semiconductor substrate 100 above the second portion 102. The second groove 62 extends to a depth d2 measured from the upper surface 11. The depth d2 may be the same as the depth d1 or may be different. The second groove 62 has a bottom portion 621 and a sidewall 622. The second groove 62 may be formed simultaneously with the first groove 61, if no mask is formed above the second portion 102 before forming the first groove 61. Nevertheless, the second groove 62 may be formed in a separate process before or after forming the first groove 61. The resulting structure is illustrated in FIG. 7B.

A second masking structure 52 may be formed at the sidewall 612 of the first groove 61. Forming the second masking structure 52 may include forming a masking material on uncovered surfaces of the first masking structure 51, of the semiconductor substrate 100 and of the first groove 61 and removing portions of the masking material. In the result, at least a portion of the bottom portion 611 of the first groove 61 is exposed. The second masking structure 52 may have a thickness of not smaller than 5 nm, or may have a thickness of not larger than 20 nm. The resulting structure is illustrated in FIG. 8A.

The masking material may be any suitable material, for instance an insulating material, for example SiN. The masking material may be formed as a conformal layer, for instance by a deposition method using CVD, HDP-CVD, ALD, MOCVD, PVD, JVD, or other suitable deposition technique. Removing the masking material from the portion of the bottom portion 611 may be accomplished by an anisotropic etching process, for example, wherein the masking material is removed from the cap layer 51 and upper surfaces of the spacers 37 as well.

Figure 8A:
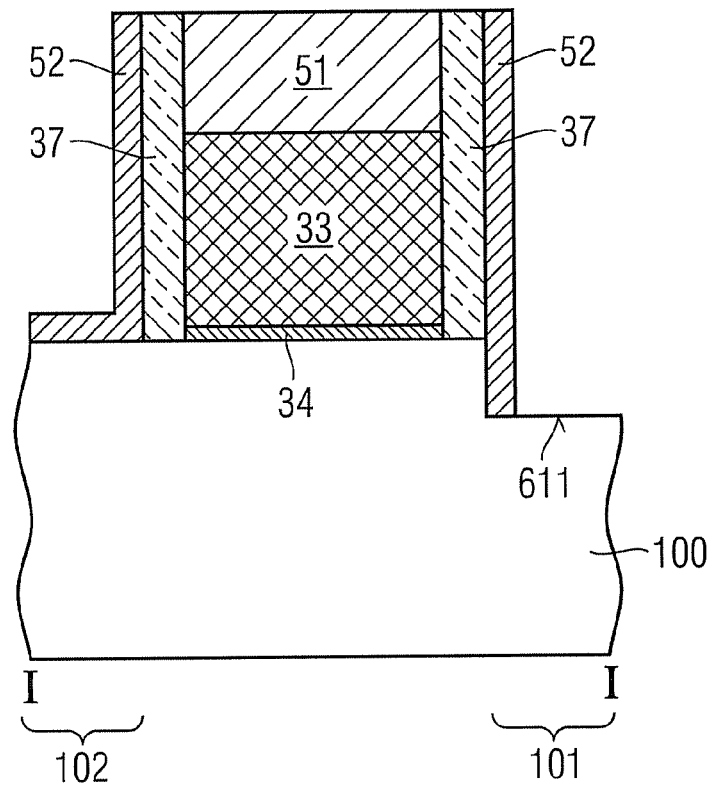
FIG. 8A illustrates a cross-sectional view of the portion of the integrated circuit of FIG. 7A after forming a second masking structure.

The second masking structure 52 may be formed above the second portion 102 of the semiconductor substrate, as illustrated in FIG. 8A. The material of the second masking structure 52 above the second portion 102 may be maintained while removing portions of the masking material from the bottom portion 611. For example, this may be accomplished by using a suitable mask, for instance a photoresist.

Figure 8B:
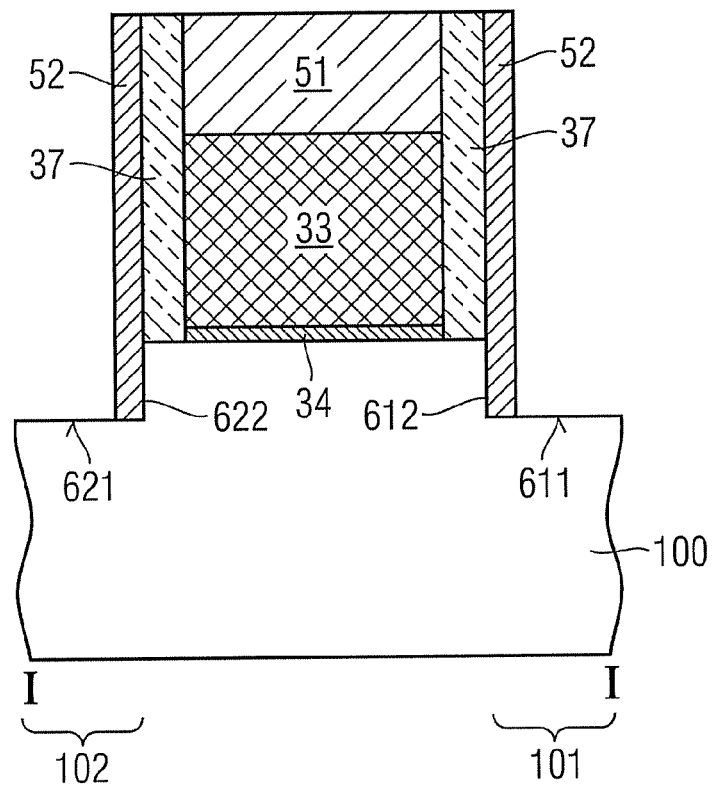
FIG. 8B illustrates a cross-sectional view of the portion of the integrated circuit of FIG. 7B after forming a second masking structure.

As illustrated in FIG. 8B, the second masking structure 52 may be formed at the sidewall 622 of the second groove 62 as well. At least a portion of the bottom portion 621 of the second groove 62 may be exposed.

After forming the second masking material 52, an additional etching process for etching the semiconductor substrate 100 within the first and/or the second groove 61, 62 may be performed.

Figure 9A:
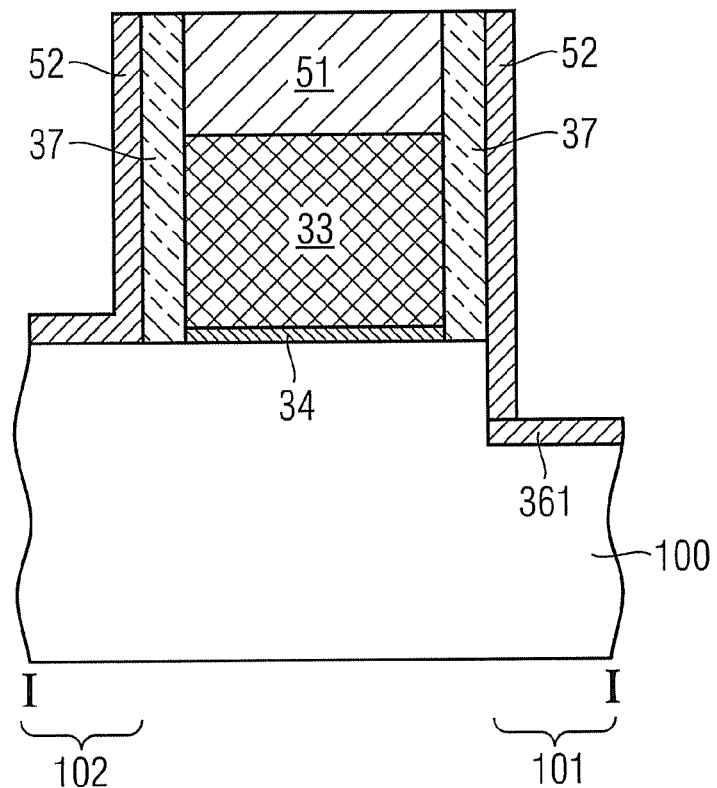
FIG. 9A illustrates a cross-sectional view of the portion of the integrated circuit of FIG. 7A after forming a first insulating structure.

A first insulating structure 361 is formed at the bottom portion 611 of the first groove 61, whereas the sidewall 612 is not covered by the first insulating structure 361. The insulating material of the first insulating structure may be different from that of the second masking structure 52. The first insulating structure 361 may be formed by a selective process, for instance by selective oxidation. Then, the insulating material of the first insulating structure 361 is formed only at exposed semiconductor surfaces. Since no semiconductor surface is exposed above the second portion 102, the insulating material of the first insulating structure 361 may not be formed above the second portion 102. A selective oxidation process may be carried out at low temperatures, for instance at temperatures below 900° C. In accordance to another embodiment, the first insulating structure 361 may be formed by depositing an insulating material using CVD, HDP-CVD, ALD, MOCVD, PVD, JVD, or other suitable deposition technique, followed by removing the insulating material from the sidewall 612. The first insulating structure 361 may be formed with a thickness of not smaller than 3 nm, and may be formed with a thickness of not larger than 20 nm. The thickness of the first insulating structure 361 may be essentially the same over the whole structure. The resulting structure is illustrated in FIG. 9A.

As is illustrated, the first insulating structure may be formed between a lower surface of the second masking structure 52 and the surface of the semiconductor substrate 100 below the second masking structure 52.

Figure 9B:
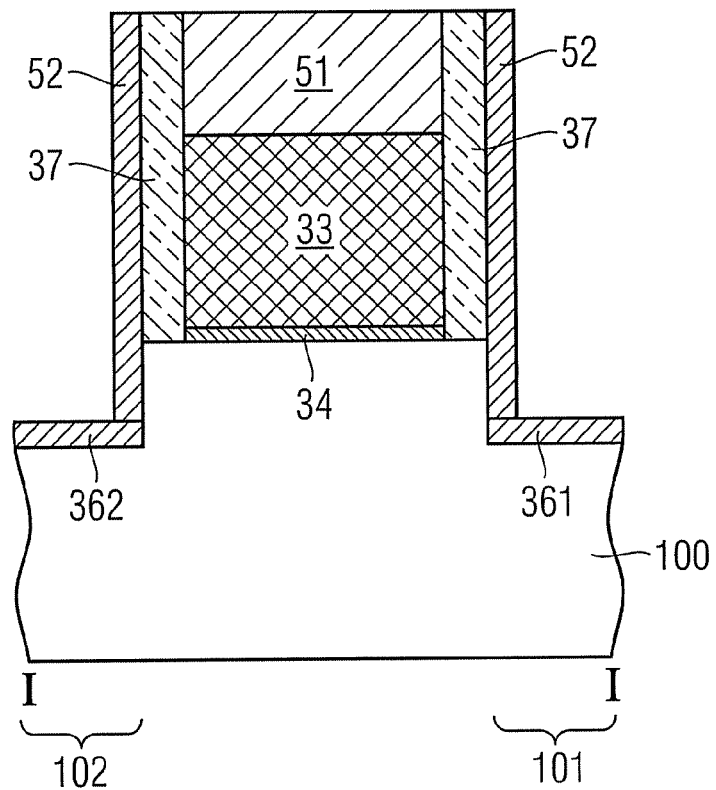
FIG. 9B illustrates a cross-sectional view of the portion of the integrated circuit of FIG. 7B after forming a first and a second insulating structure.

A second insulating structure 362 may be formed at the bottom portion 621 of the second groove 62, whereas the sidewall 622 is not covered by the second insulating structure 362. The second insulating structure 362 may be formed similar to the first insulating structure 361. The first and the second insulating structure 361, 362 may be formed simultaneously. The second insulating structure 362 may be formed of the same insulating material or of a different insulating material as the first insulating structure 361, and may be formed with the same or with a different thickness. The resulting structure is illustrated in FIG. 9B.

Figure 10A:
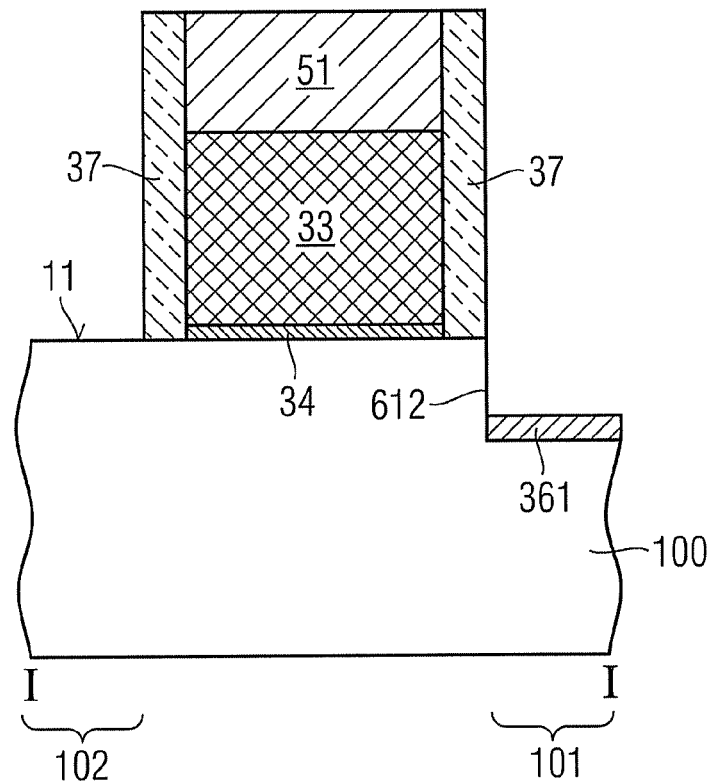
FIG. 10A illustrates a cross-sectional view of the portion of the integrated circuit of FIG. 7A after removing the second masking structure.

The second masking structure 52 may be removed, for instance by dry or wet etching processes which are selective to the semiconductor material of the semiconductor substrate 100 and to the insulating material of the first insulating structure 361. In the result, the sidewall 612 of the first groove 61 and the upper surface 11 of the semiconductor substrate 100 above the second portion 102 are exposed, as illustrated in FIG. 10A.

Nevertheless, the second masking structure 52 may not be removed from the semiconductor substrate 100 above the second portion 102. For example, a mask, for instance a photoresist material, may be formed above the second portion 102 before removing the second masking structure 52 from the sidewall 612 of the first groove 61.

Figure 10B:
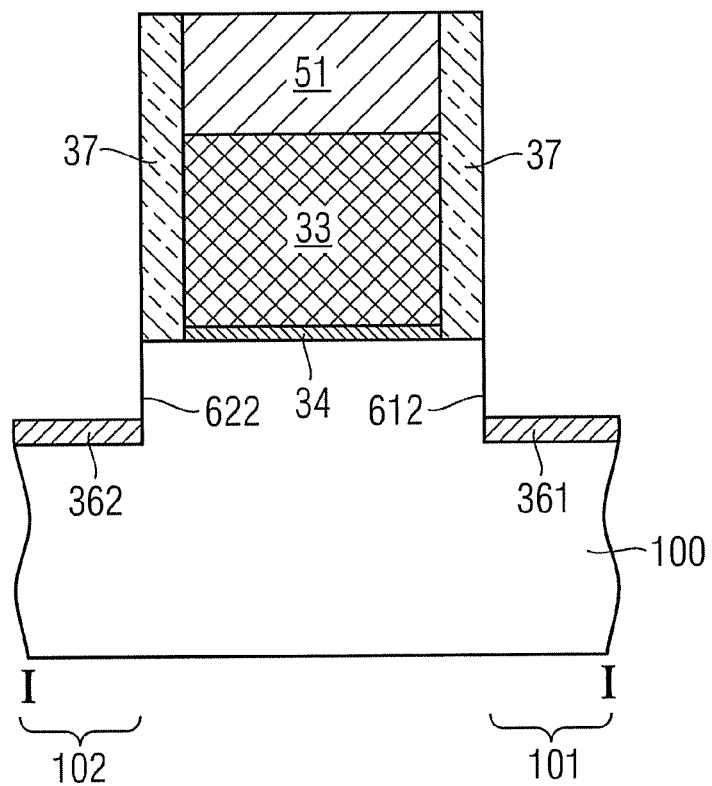
FIG. 10B illustrates a cross-sectional view of the portion of the integrated circuit of FIG. 7B after removing the second masking structure.

The second masking structure 52 may be removed from the sidewall 622 of the second groove 62 as well, leaving the sidewall 622 unexposed, as illustrated in FIG. 10B.

Figure 11A:
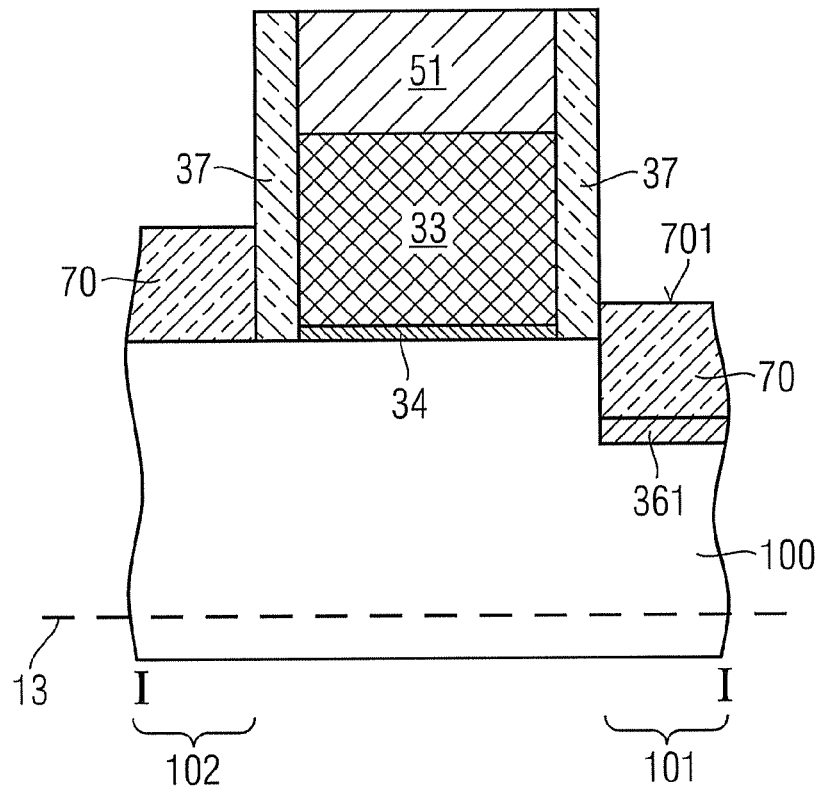
FIG. 11A illustrates a cross-sectional view of the portion of the integrated circuit of FIG. 7A after forming a semiconductor material.

As illustrated in FIG. 11A, a semiconductor material 70 may be formed above the first insulating structure 361. The semiconductor material 70 may be formed above the second portion 102 as well. The semiconductor material 70 may be formed adjacent to the semiconductor substrate 100. Nevertheless, an ultra-thin intermediate layer, for instance of SiN, may be formed at the sidewall 612 prior to forming the semiconductor material 70 in order to reduce interface level traps. The semiconductor material 70 may be formed by deposition using CVD, HDP-CVD, ALD, PVD, JVD, or other suitable deposition technique or may be formed by an epitaxial growth process or may be formed by a combination of an epitaxial process and a deposition process. The semiconductor material 70 may be formed as a polycrystalline, an amorphous or a monocrystalline material. It may be formed undoped or in-situ doped. In case of an epitaxial growth process, the semiconductor substrate 100 may be rotated, for example by 45°, in order to modulate the growth rate and or the final shape of the semiconductor material 70.

An upper surface 701 of the semiconductor material 70 above the first portion 101 may be formed at the same height measured from the reference position 13 as the upper surface 11 of the semiconductor substrate 100. Nevertheless, the upper surface 701 may be formed at a larger or a smaller height than the upper surface 11.

The semiconductor material 70 may be formed above the second portion 102 as well, as illustrated in FIG. 11A. That semiconductor material 70 may correspond to the additional semiconductor material 321 illustrated in FIG. 1A, for example. According to another embodiment, no semiconductor material 70 may be formed above the second portion 102, for instance if a masking material, for example the second masking structure 52, covers the semiconductor substrate 100 in the second portion 102.

Figure 11B:
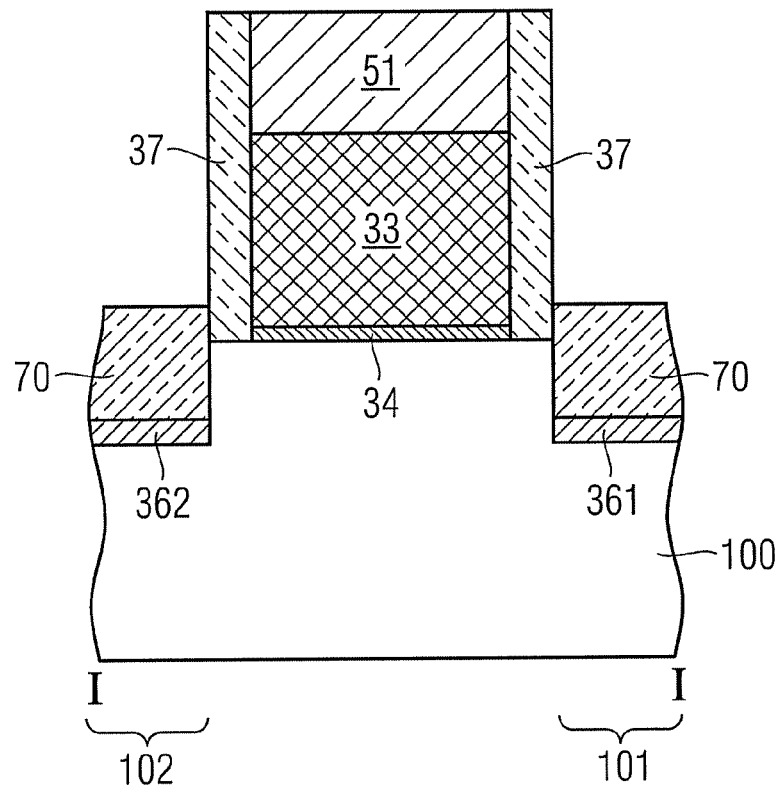
FIG. 11B illustrates a cross-sectional view of the portion of the integrated circuit of FIG. 7B after forming a semiconductor material.
Figure 12:
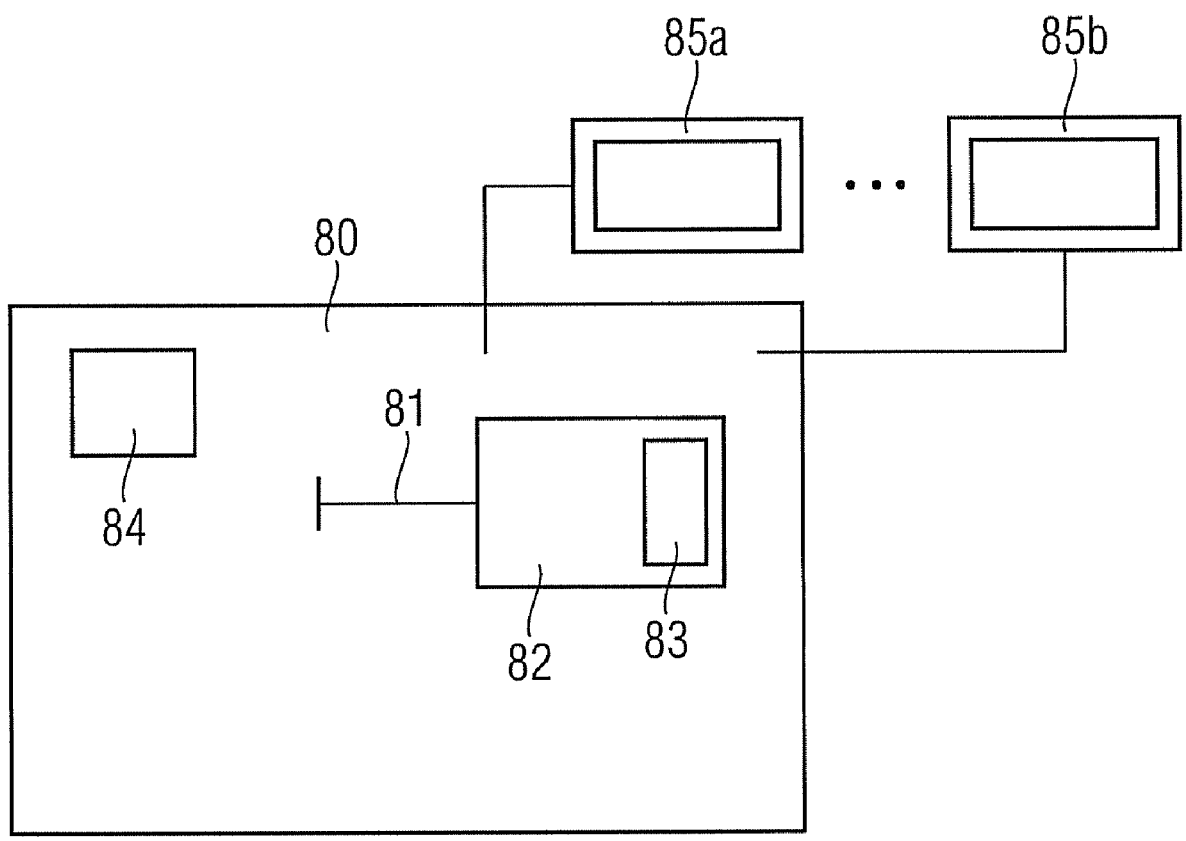
FIG. 12 illustrates one embodiment of an electronic device including an integrated circuit according to another embodiment.

As illustrated in FIG. 11B, according to another embodiment, the semiconductor material 70 may be formed above the second insulating structure 362 above the second portion 102. The semiconductor material 70 above the second portion 102 may be the same semiconductor material as that above the first portion 101 or may be a different semiconductor material. It may be formed similar to the semiconductor material above the first portion 101 and may be formed simultaneously with the semiconductor material 70 above the first portion 101.

A doping process for forming a first and a second source/drain region 31, 32 may be performed after forming the semiconductor material 70 to form an access transistor 30. Furthermore, a storage element, for instance a storage capacitor 40, and a connecting structure, for instance a node contact 46, may be formed, wherein the first source/drain region 31 is electrically coupled to the storage element by the connecting structure. In the result, an embodiment of a transistor 30, as illustrated in FIGS. 1A to 1C, or of a memory cell 20, as illustrated in FIGS. 2 to 3B for example, may be formed.

FIG. 17 schematically illustrates an electronic device 80 according to an embodiment. The electronic device 80 may include an interface 81 and a component 82 which is adapted to be interfaced by the interface 81. The electronic device 80, for example the component 82, may include an integrated circuit 83 or a semiconductor chip as has been explained above. The component 82 may be connected in an arbitrary manner with the interface 81. For example, the component 82 may be externally placed and may be connected with the device 80 by the interface 81. Moreover, the component 82 may be housed inside the electronic device 80 and may be connected with the interface 81. By way of example, it is also possible that the component 82 is removably placed into a slot which is connected with the interface 81. When the component 82 is inserted into the slot, a semiconductor chip or integrated circuit 83 is interfaced by the interface 81. The electronic device 80 may further include a processing device 84 for processing data. In addition, the electronic device 80 may further include one or more display devices 85a, 85b for displaying data. The electronic device may further include components which are configured to implement a specific electronic system. Examples of the electronic system include a computer, for example, a personal computer, or a notebook, a server, a router, a game console, for example, a video game console, as a further example, a portable video game console, a graphics card, a personal digital assistant, a digital camera, a cell phone, an audio system such as any kind of music player or a video system. For example, the electronic device 80 may be a portable electronic device.

The embodiments of the invention described in the foregoing description are examples given by way of illustration and the invention is nowise limited thereto. Any modification, variation and equivalent arrangement should be considered as being included within the scope of the invention.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a transistor comprising:
     a first source/drain region,
     a channel region formed between the first and a second source/drain region in an active area of a semiconductor substrate, and
     a gate electrode, configured to control a conductivity of the channel region, wherein the gate electrode is arranged adjacent to three sides of the channel region; and
   a first insulating structure being part of the integrated circuit and being disposed between the first source/drain region and a first portion of the semiconductor substrate, the first portion being arranged below the first source/drain region;
   wherein the active area is electrically coupled to the first portion of the semiconductor substrate; and
   wherein an upper surface of the first source/drain region is formed above an upper surface of the semiconductor substrate.

2. An integrated circuit comprising:
   a transistor comprising:
     a first source/drain region,
     a channel region formed between the first and a second source/drain region in an active area of a semiconductor substrate, and
     a gate electrode, configured to control a conductivity of the channel region, wherein the gate electrode is arranged adjacent to three sides of the channel region; and
   a first insulating structure being part of the integrated circuit and being disposed between the first source/drain region and a first portion of the semiconductor substrate, the first portion being arranged below the first source/drain region;
   wherein the active area is electrically coupled to the first portion of the semiconductor substrate; and
   wherein an upper surface of the second source/drain region is formed above an upper surface of the first source/drain region.

3. The integrated circuit of claim 2, further comprising:
   a second insulating structure disposed between the second source/drain region; and
   a second portion of the semiconductor substrate, the second portion being arranged below the second source/drain region and being electrically coupled to the active area.

4. A method of manufacturing an integrated circuit, the method comprising:
   forming a first groove in a semiconductor substrate above a first portion of the semiconductor substrate;
   forming a first insulating structure at a bottom portion of the first groove;
   forming a first source/drain region of an access transistor above the first insulating structure;
   forming a channel region of the access transistor such that it is electrically coupled to the first portion of the semiconductor substrate;
   forming a connecting structure, configured to electrically couple the first source/drain region of the access transistor to a storage element; and wherein forming the first groove comprises forming a first masking structure on an upper surface of the semiconductor substrate, the first masking structure comprising a gate electrode of the access transistor.

5. A method of manufacturing an integrated circuit, the method comprising:
   forming a first groove in a semiconductor substrate above a first portion of the semiconductor substrate;
   forming a first insulating structure at a bottom portion of the first groove;
   forming a first source/drain region of an access transistor above the first insulating structure;
   forming a channel region of the access transistor such that it is electrically coupled to the first portion of the semiconductor substrate;
   forming a connecting structure, configured to electrically couple the first source/drain region of the access transistor to a storage element; and
   wherein forming the first source/drain region comprises forming a semiconductor material within the first groove after forming the insulating structure.

6. The method of claim 5, comprising forming the semiconductor material within the first groove as a single-crystalline material by epitaxial growth.

7. A method of manufacturing an integrated circuit, the method comprising:
   forming a first groove in a semiconductor substrate above a first portion of the semiconductor substrate;
   forming a first insulating structure at a bottom portion of the first groove;
   forming a first source/drain region of an access transistor above the first insulating structure;
   forming a channel region of the access transistor such that it is electrically coupled to the first portion of the semiconductor substrate;
   forming a connecting structure, configured to electrically couple the first source/drain region of the access transistor to a storage element;
   forming a second groove in the semiconductor substrate above a second portion of the semiconductor substrate;
   forming a second insulating structure at a bottom portion of the second groove; and
   forming a second source/drain region of the access transistor above the second insulating structure.

8. The method of claim 7, comprising forming the first and the second groove using a first masking structure formed on an upper surface of the semiconductor substrate as a mask.

9. The method of claim 7, wherein forming the first source/drain region and forming the second source/drain region comprise forming a semiconductor material within the first and the second groove after forming the first and the second insulating structure.

10. The method of claim 9, comprising forming the semiconductor material within the first and the second groove as a single-crystalline material by epitaxial growth.

* * * * *